United States Patent [19]

Genrich et al.

[11] 4,404,531
[45] Sep. 13, 1983

[54] FREQUENCY SCANNING APPARATUS WHEREIN A SINGLE KNOB CONTROLS BOTH STEP SIZE AND DIRECTION OF CHANGE

[75] Inventors: Thad J. Genrich, Mesa; Robert H. Bickley, Scottsdale, both of Ariz.

[73] Assignee: Motorola, Inc., Schaumburg, Ill.

[21] Appl. No.: 156,886

[22] Filed: Jun. 5, 1980

[51] Int. Cl.³ .............................................. H03B 1/00
[52] U.S. Cl. ...................................... 331/64; 328/14; 331/179; 455/165; 455/185
[58] Field of Search ...................... 331/64, 178, 179, 2; 328/14; 455/165, 185; 324/77 CS

[56] References Cited

U.S. PATENT DOCUMENTS

| | | | |
|---|---|---|---|
| 3,665,323 | 5/1972 | Peterson | 328/14 |
| 3,803,494 | 4/1974 | Howell et al. | 455/165 |
| 4,086,544 | 4/1978 | Fried | 328/14 X |
| 4,270,117 | 5/1981 | Ziegelbein et al. | 455/185 X |

Primary Examiner—Siegfried H. Grimm
Assistant Examiner—Edward P. Westin
Attorney, Agent, or Firm—Eugene A. Parsons

[57] ABSTRACT

A scan rate switch is interfaced to a microprocessor which controls a digitally programmed frequency synthesizer. The scan rate switch includes a plurality of different increment or decrement (frequency steps) positions with the apparatus changing the frequency at a fixed rate of five steps per second for as long as the switch is in any of the positions.

9 Claims, 2 Drawing Figures

FREQUENCY SCANNING APPARATUS WHEREIN A SINGLE KNOB CONTROLS BOTH STEP SIZE AND DIRECTION OF CHANGE

BACKGROUND OF THE INVENTION

The ability to change the output frequency and/or scan a selected range of frequencies in variable step sizes is essential to many types of test equipment, spectrum analyzers, signal generators and other devices using frequency synthesizers. In prior art structures it is generally common to provide a switch for incrementing (increasing the frequency in steps), a switch for decrementing (decreasing the output frequency in steps), a switch for selecting the size of the frequency step change and a rate switch which controls the number of steps per second that the frequency is changed. Generally, all of these switches provide the operator with versatility but require considerable attention, and in many instances both hands, in the use thereof.

SUMMARY OF THE INVENTION

The present invention pertains to frequency scanning apparatus incorporating frequency synthesizing means providing an output frequency within a range of frequencies and capable of being altered in a variety of predetermined steps in response to a control signal, a multimode switch for selecting any of the variety of predetermined steps in an increment or decrement mode and control signal generating means coupled to the multimode switch and supplying control signals to the synthesizing means in response to the selection of one of the variety of predetermined steps, to control the synthesizing means to alter the output frequency by the selected predetermined step, and the control signal further controlling the synthesizing means to alter the output frequency a predetermined number of steps per unit of time that the switch is in the selected mode.

It is an object of the present invention to provide new and improved frequency scanning apparatus.

It is a further object of the present invention to provide new and improved frequency scanning apparatus wherein a single control knob is utilized to alter the size of increments or decrements and the number of increments or decrements per unit of time is fixed.

It is a further object of the present invention to provide new and improved frequency scanning apparatus incorporating a single control for best operator convenience while maintaining substantial versatility.

These and other objects of this invention will become apparent to those skilled in the art upon consideration of the accompanying specification, claims and drawings.

Referring to the drawings, wherein like characters indicate like parts throughout the figures:

FIG. 1 is a block diagram of frequency scanning apparatus incorporating the present invention; and FIG. 2 is a pictorial view of frequency scanning apparatus incorporating the present invention.

DESCRIPTION OF THE PREFERRED EMBODIMENT

Figure 1:
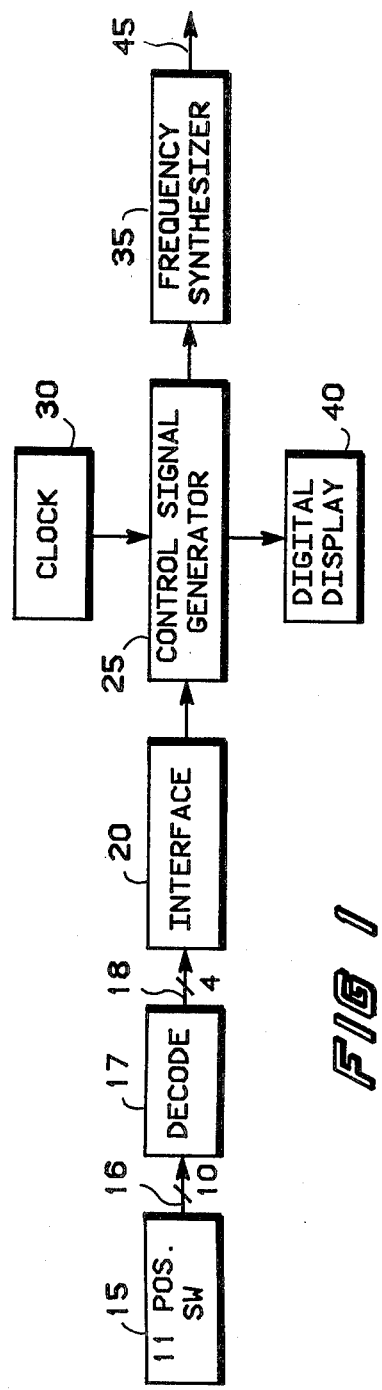

Referring specifically to the drawings, the number 15 indicates a multimode switch, which in this embodiment is an 11 position switch. The switch 15 is connected through a 10 conductor bus 16 to a decode circuit 17. The 10 leads are connected to each position of the switch 15, except the position representing 0, and the switch 15 may, for example, simply ground the lead connected to a selected position or apply a voltage thereto. The decode circuit 17 then senses the condition of each of the leads and provides a 4 bit digital signal on a 4 wire bus 18 at the output thereof. Decoders of this type are well known in the art and are commercially available so that the function thereof need not be explained further. Thus, each of the positions of the switch 15 produces a unique signal on the bus 16 which is converted to a unique digital signal on the bus 18. It will of course be understood by those skilled in the art that a variety of multimode switching means might be utilized to provide unique indications of the various modes and the present switch 15 and decode 17 are simply illustrated because of their simplicity.

The bus 18 is connected through an interface 20 to a control signal generator 25. In the present embodiment the control signal generator 25 is a commercially available microprocessor and the interface 20 is standard input circuitry. It will of course be understood by those skilled in the art that other generating means might be utilized to provide the functions described below and an interface might not be required therewith. A clock 30 is connected to the generator 25 to aid in providing the desired output signals and the timing required. Signals from the generator 25 are applied to a frequency synthesizer 35 and a digital display 40. The desired output signals are available at an output terminal 45, connected to the frequency synthesizer 35, and the frequency of the signal at the terminal 45 is displayed on the digital display 40. The digital display 40 could be an oscilloscope which also displays other characteristics of signals from test equipment associated with the frequency scanning apparatus or it could be simply a seven segment or dot matrix digital display for visually displaying the output frequency of the present apparatus.

The frequency synthesizer 35 contains circuitry for providing an output frequency within a range of frequencies and further circuitry for altering the output frequency in any of a variety of predetermined increments or decrements in response to a digital control signal applied at the input thereof. A typical frequency synthesizer which may be utilized for the synthesizer 35 is described in a U.S. patent application entitled "Frequency Synthesizer", filed June 3, 1980, Ser. No. 156,221, and assigned to the same assignee. The control signal applied to the frequency synthesizer 35 is a multibit digital word which is applied to one or more programmable dividers or counters in phase locked loops to control the output frequency at the terminal 45. The programmable dividers change the output frequency in predetermined steps (increments or decrements) with each specific step of frequency being represented by a unique digital input signal. The control signal generator 25 is simply a switching and interconnection circuit which remembers the present output frequency at the terminal 45 and, in response to the 4 bit digital signal at the interface 20 which orders a specific increment or decrement, generates a digital control signal which controls the synthesizer 35 to alter the output frequency by the increment or decrement selected. The switch 15 only determines the size and direction of the increment or decrement and the generator 25, with the help of the clock 30, includes a fixed rate of change.

Figure 2:
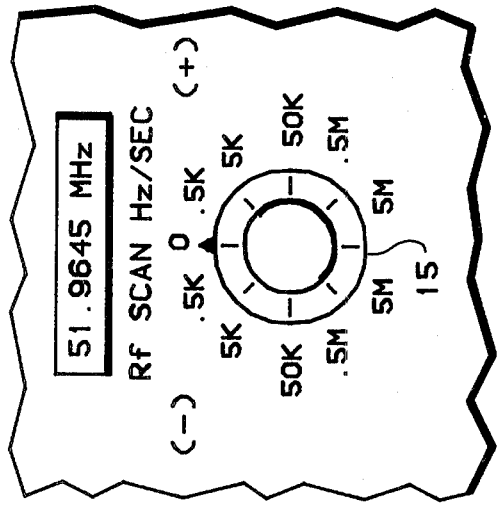

In the present embodiment, the various positions of the switch 15 are each designated by a predetermined number of hertz per second. Referring specifically to FIG. 2, the normal position of the switch 15 is the center position illustrated which is a zero change in the output frequency at the terminal 45. To increase the frequency at the terminal 45 the switch 15 is turned in a clockwise direction with the first step providing a 500 hertz per second change, the second step providing 5 kilohertz per second change, the third step providing 50 kilohertz per second change, the fourth step providing 0.5 megahertz per second change and the fifth step providing 5 megahertz per second change. To reduce the frequency at the output terminal 45 the switch 15 is turned in the counter-clockwise direction with the 5 positions representing the same size steps, or decrements, as described for the clockwise movement.

In the operation of the present apparatus the position of the switch 15 selects a predetermined size of increment or decrement and the generator 25 with the clock 30 causes that increment or decrement to occur at a predetermined rate or number of times per second. For example, in the first clockwise position of the switch 15 (500 hertz per second change) the switch 15 orders a 100 hertz increment at the generator 25. The generator 25 supplies a control signal to the synthesizer 35 which causes the output of the synthesizer 35 to increase in 100 hertz steps. The generator 25 further orders the steps to occur at the rate of 5 per second for as long as the switch 15 is in the first clockwise position. Similarly, the second through the fifth positions of the switch 15 cause 1 kilohertz, 10 kilohertz, 100 kilohertz and 1 megahertz increments, respectively, with the fixed rate of 5 steps per second being supplied by the generator 25. Decrements in response to counter-clockwise movements of the switch 15 are similarly generated.

As a typical example of the operations of the control signal generator 25, the circuitry described in the above identified application requires a 14 bit control signal supplied to a first programmable divider to produce 100 Hz steps and a 15 bit control signal supplied to a second programmable divider to produce 100 KHz steps. Predetermined combinations of the two control signals can provide 100 Hz steps of frequency between (in the above circuitry) 10 KHz and 1 GHz. In its simplest form the generator 25 has all possible control signals stored therein and the incoming four bit digital signal simply selects (or causes the generator to select) a control signal which represents a frequency the correct step away from (increment or decrement) the present output frequency. Assume that all zeros in both control signals represent the lowest frequency (10 KHz). If the four bit digital signal calls for a 100 Hz step (for this example 0001) the 15 bit control signal will remain the same and the next highest 14 bit control signal will be selected. Since the generator 25 knows (remembers) from the last control signal what the output frequency is, the generator 25 has only to select the next highest step of frequency five times per second for the 100 Hz digital signal, or the tenth higher step for a 1 KHz digital signal, etc. The control signal supplied by the generator 25 changes 5 times per second for as long as the switch 15 is in any position except zero.

Thus, the farther an operator moves the switch 15 in a clockwise or counter-clockwise direction, the faster the frequency output at the terminal 45 changes and it can be seen that the operator has complete and highly versatile control over the output frequency with a single control knob. This greatly improves the convenience for the operator and provides a wide range of channel sweep rates. The present apparatus allows a convenient means of examining a large number of frequencies with minimal operator effort and the variable rate of scan allows a large change of frequency to be made rapidly and then progressively smaller steps can be used to "home in" on the final desired setting.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

I claim:

1. Frequency scanning apparatus comprising:
   (a) frequency synthesizing means providing an output frequency within a range of frequencies and altering the output frequency in any of a variety of predetermined steps in response to a control signal;
   (b) multimode switching means providing an output signal indicative of a selected mode of said switching means, each mode being representative of a different step change of frequency; and
   (c) control signal generating means coupled to receive the output signal from said switching means and generating control signals representative of the selected step changes, said generating means including apparatus for supplying to said frequency synthesizing means a predetermined number of the control signals per unit of time to alter the output frequency the predetermined number of the selected step changes per unit of time.

2. Frequency scanning apparatus as claimed in claim 1 wherein the control signal generating means includes a microprocessor.

3. Frequency scanning apparatus comprising:
   (a) frequency synthesizing means providing an output frequency within a range of frequencies and altering the output frequency in any of a variety of predetermined steps in response to a control signal;
   (b) multimode switching means providing an output signal indicative of a selected mode of said switching means, each mode being representative of a different step change of frequency;
   (c) decoding means connected to said switching means for receiving the output signal therefrom and providing a digital signal representative of the output signal;
   (d) control signal generating means connected to receive the digital signal from said decoding means and generating control signals representative of the selected step changes, said generating means including apparatus for supplying to said frequency synthesizing means a predetermined number of the control signals per unit of time to alter the output frequency the predetermined number of the selected step changes per unit of time.
   (e) connecting means for connecting the control signal from said generating means to said frequency synthesizing means and
   (f) display means coupled to said generating means for providing a visual display of the output frequency of said synthesizing means.

4. Frequency scanning apparatus as claimed in claim 3 wherein the control signal generating means includes a microprocessor.

5. Frequency scanning apparatus as claimed in claim 4 wherein the multimode switching means includes a multi-position manual switch having a plurality of positions for increasing the output frequency in a variety of predetermined steps and a plurality of positions for decreasing the output frequency in a variety of predetermined steps.

6. Frequency scanning apparatus as claimed in claim 5 wherein the multiposition manual switch includes at least eleven positions.

7. Frequency scanning apparatus as claimed in claim 6 wherein the eleven positions include one position of zero frequency change and ten positions of a frequency step change including approximately ±100 Hz, ±1 KHz, ±10 KHz, ±100 KHz and ±1 MHz.

8. Frequency scanning apparatus as claimed in claim 7 wherein the control signal from the generating means includes at least 5 step changes per second so that the ten positions produce a net change of ±500 Hz, ±5 KHz, ±50 KHz, ±500 KHz and ±5 MHz per second, respectively.

9. Frequency scanning apparatus comprising:

(a) frequency synthesizing means for providing an output frequency within a range of frequencies and capable of being altered in a variety of predetermined steps in response to a control signal;

(b) multimode switch means for selecting any of the variety of predetermined steps in an increment or decrement mode; and (c) control signal generating means coupled to said multimode switch means and supplying control signals to said synthesizing means in response to the selection of one of the variety of predetermined steps, for controlling the synthesizing means to alter the output frequency by the selected predetermined step, and the control signal further controlling said synthesizing means to alter the output frequency a predetermined number of steps per unit of time for as long as said switch means is in the selected mode.

* * * * *